United States Patent
Maguire et al.

(10) Patent No.: US 11,067,644 B2
(45) Date of Patent: *Jul. 20, 2021

(54) WEARABLE AUDIO DEVICE WITH NULLING MAGNET

(71) Applicant: Bose Corporation, Framingham, MA (US)

(72) Inventors: Stephen J. Maguire, Grafton, MA (US); Andrew Munro, Northborough, MA (US)

(73) Assignee: Bose Corporation, Framingham, MA (US)

( * ) Notice: Subject to any disclaimer, the term of this patent is extended or adjusted under 35 U.S.C. 154(b) by 55 days.

This patent is subject to a terminal disclaimer.

(21) Appl. No.: 16/353,185

(22) Filed: Mar. 14, 2019

(65) Prior Publication Data

US 2020/0292633 A1    Sep. 17, 2020

(51) Int. Cl.
*G01R 33/00* (2006.01)
*G01R 33/02* (2006.01)
*H04R 1/10* (2006.01)

(52) U.S. Cl.
CPC ..... *G01R 33/0047* (2013.01); *G01R 33/0094* (2013.01); *G01R 33/0206* (2013.01); *H04R 1/1016* (2013.01)

(58) Field of Classification Search
CPC .............. H04R 1/1041; H04R 2225/41; H04R 1/1016; H04R 25/407; H04R 5/033; H04R 1/1083; H04R 2225/025; H04R 2225/61; H04R 25/405; H04R 25/453; H04R 1/02; H04R 1/1075; H04R 2460/17; H04R 5/04;

(Continued)

(56) References Cited

U.S. PATENT DOCUMENTS 5,126,669 A    6/1992    Hones et al.
5,991,085 A    11/1999    Rallison et al.
(Continued)

FOREIGN PATENT DOCUMENTS

EP    2645750 A1    10/2013
WO    2013155217 A1    10/2013

OTHER PUBLICATIONS

The International Search Report and the Written Opinion of the International Searching Authority dated Jun. 29, 2020 or PCT Application No. PCT/US2020/023485.

(Continued)

*Primary Examiner* — Vinh P Nguyen
(74) *Attorney, Agent, or Firm* — Brian M. Dingman; Dingman IP Law, PC

(57) ABSTRACT

A wearable audio device with an electro-acoustic transducer that is configured to create audio output. The transducer has a transducer magnet that produces a transducer magnetic field having a magnetic field strength, and a magnetic structure such as a cup that guides the transducer magnetic field. The transducer magnet is on the inside of the magnetic structure. There is a magnetic field sensor outside of the magnetic structure; the magnetic field sensor is constructed and arranged to sense the Earth's magnetic field. A nulling magnet is coupled to or proximate the outside of the magnetic structure and is constructed and arranged to produce a nulling magnetic field that reduces the strength of the transducer magnetic field at the magnetic field sensor.

20 Claims, 7 Drawing Sheets

(58) Field of Classification Search
CPC ...... H04R 9/025; H04R 9/06; H04R 2225/43; H04R 25/30; H04R 25/305; H04R 25/43; H04R 1/028; H04R 1/1008; H04R 2460/13; H04R 25/70; G01R 33/4806; G01R 27/02; G01R 29/0878; G01R 33/0035; G01R 33/0206; G01R 29/0814; H04S 2420/05; G10K 11/17823; G10K 2210/1081; G10K 2210/3044; H01F 2038/143

See application file for complete search history.

(56) References Cited

U.S. PATENT DOCUMENTS

| | | | |
|---|---|---|---|
| 9,141,194 | B1 | 9/2015 | Keyes et al. |
| 9,369,791 | B2 * | 6/2016 | Tanaka .................. H04R 1/1016 |
| 9,854,345 | B2 * | 12/2017 | Briggs .................. H04R 1/1033 |
| 9,883,280 | B2 * | 1/2018 | Oosato .................. H04R 1/2857 |
| 9,996,162 | B2 | 6/2018 | Kar et al. |
| 10,212,507 | B1 * | 2/2019 | Maguire .............. H04R 1/1016 |
| 10,516,929 | B2 * | 12/2019 | Maguire ............ G01R 33/0017 |
| 10,575,107 | B2 | 2/2020 | So et al. |
| 10,841,716 | B2 | 11/2020 | Perri et al. |
| 2005/0092919 | A1 | 5/2005 | Bellec et al. |
| 2005/0111673 | A1 | 5/2005 | Rosen et al. |
| 2006/0018075 | A1 | 1/2006 | Schultz |
| 2006/0034478 | A1 | 2/2006 | Davenport |
| 2007/0092093 | A1 | 4/2007 | Shim |
| 2009/0296947 | A1 | 12/2009 | Duron et al. |
| 2011/0044485 | A1 | 2/2011 | Lin et al. |
| 2011/0206225 | A1 | 8/2011 | Moller et al. |
| 2011/0273169 | A1 | 11/2011 | LaCroix |
| 2011/0291497 | A1 | 12/2011 | Choi |
| 2012/0219166 | A1 | 8/2012 | Ball |
| 2013/0272563 | A1 | 10/2013 | Boyd |
| 2013/0329910 | A1 | 12/2013 | Crosby et al. |
| 2015/0003662 | A1 | 1/2015 | Vernon et al. |
| 2015/0181355 | A1 | 6/2015 | Pedersen |
| 2015/0195639 | A1 | 7/2015 | Azmi et al. |
| 2015/0281852 | A1 | 10/2015 | Sacha et al. |
| 2015/0326963 | A1 | 11/2015 | Sorensen et al. |
| 2015/0365755 | A1 | 12/2015 | Harper |
| 2017/0014071 | A1 | 1/2017 | Readdie et al. |
| 2017/0090003 | A1 | 3/2017 | Guo |
| 2017/0093079 | A1 | 3/2017 | Wagman et al. |
| 2017/0160086 | A1 | 6/2017 | Kesaniemi |
| 2017/0208382 | A1 | 7/2017 | Grinker |
| 2017/0295443 | A1 | 10/2017 | Boesen |
| 2018/0070166 | A1 | 3/2018 | Howell et al. |
| 2018/0088185 | A1 | 3/2018 | Woods et al. |
| 2018/0096770 | A1 | 4/2018 | Danielson et al. |
| 2018/0115816 | A1 | 4/2018 | Panecki et al. |
| 2018/0115839 | A1 | 4/2018 | Eichfeld et al. |
| 2018/0193728 | A1 | 7/2018 | Bashkirov et al. |
| 2018/0211751 | A1 | 7/2018 | Khoshkava et al. |
| 2019/0281376 | A1 | 9/2019 | Maquire et al. |
| 2019/0281377 | A1 | 9/2019 | Maguire et al. |
| 2020/0280788 | A1 | 9/2020 | Maguire |
| 2020/0292633 | A1 | 9/2020 | Maguire et al. |
| 2020/0300932 | A1 | 9/2020 | Maguire |
| 2020/0304895 | A1 | 9/2020 | Maguire |

OTHER PUBLICATIONS

The International Search Report and the Written Opinion of the International Searching Authority dated Jul. 4, 2019 for PCT Application No. PCT/US2019/020914.

U.S. Appl. No. 62/626,967, filed Feb. 6, 2018; Applicant: Bose Corporation.

* cited by examiner

WEARABLE AUDIO DEVICE WITH NULLING MAGNET

BACKGROUND

This disclosure relates to a wearable audio device such as an earphone.

Wearable audio devices (e.g., earbuds or headphones) can include orientation tracking systems that use a magnetometer to track motions of the head and the direction in which the wearer is looking. Magnetometers need to accurately detect the Earth's magnetic field. The wearable audio device's electro-acoustic transducer typically includes a magnet. The wearable audio device can also include a magnet used to dock or park the wearable audio device to another structure. Since some wearable audio devices, such as in-ear headphones (sometimes also called earbuds) are desirably quite small, of necessity the magnetometer is close to the other magnets. The magnetic field of the other magnets may have a magnetic field strength that is much greater than the Earth's magnetic field. Accordingly, the magnetic fields can overwhelm the magnetometer and prevent it from working properly.

SUMMARY

All examples and features mentioned below can be combined in any technically possible way.

In one aspect, a wearable audio device includes an electro-acoustic transducer for creating audio output, the electro-acoustic transducer comprising a transducer magnet that produces a transducer magnetic field having a magnetic field strength, and a magnetic structure such as a cup that guides the transducer magnetic field, wherein the transducer magnet is on an inside of the magnetic structure, and the magnetic structure has an outside. A magnetic field sensor outside of the magnetic structure is constructed and arranged to sense the Earth's magnetic field. A nulling magnet is coupled to or proximate the outside of the magnetic structure and is constructed and arranged to produce a nulling magnetic field that reduces the strength of the transducer magnetic field at the magnetic field sensor.

Examples may include one of the above and/or below features, or any combination thereof. The magnetic field sensor may comprise a three-axis magnetometer. The nulling magnet may comprise a permanent magnet or an electromagnet. The magnetic field sensor may have a sensed magnetic field range where it operates linearly, and the nulling magnetic field may reduce the strength of the transducer magnetic field at the magnetic field sensor such that the sensed magnetic field strength is in the sensed magnetic field range where the magnetic field sensor operates linearly. The wearable audio device may comprise an earbud comprising an earbud body. The electro-acoustic transducer, the magnetic field sensor, and the nulling magnet may all be located within the earbud body. The earbud body may be constructed and arranged to be positioned at or near an ear of a wearer or otherwise, so as to direct the audio output toward the ear of the wearer. The transducer magnetic field at the magnetic field sensor may have a direction along a magnetic field axis, and the nulling magnetic field at the magnetic field sensor may have an opposite direction along the magnetic field axis. The strength of the transducer magnetic field at the magnetic field sensor may be at least 100 µT and less than 1500 µT.

Examples may include one of the above and/or below features, or any combination thereof. The transducer magnet, the magnetic structure, and the nulling magnet may be aligned along a longitudinal axis. The magnetic field sensor may also be aligned along the longitudinal axis. The transducer magnet, the magnetic structure, and the nulling magnet may all be symmetric with respect to the longitudinal axis. The nulling magnet may be cylindrical or annular. The nulling magnet may comprise a central opening. The wearable audio device may further comprise an acoustically-resistive mesh over the central opening of the nulling magnet. The wearable audio device may further comprise a magnetic field shield located between the nulling magnet and the magnetic field sensor. The magnetic field shield may comprise a cup comprising magnetic material.

In another aspect, a wearable audio device includes an electro-acoustic transducer for creating audio output, the electro-acoustic transducer comprising a transducer magnet that produces a transducer magnetic field having a magnetic field strength, and a rear plate comprising magnetic material, wherein the rear plate is configured to guide the transducer magnetic field, wherein the transducer magnet is on an inside of the rear plate and the rear plate has an outside. A body is constructed and arranged to be positioned at an ear of a wearer so as to direct the audio output at the ear of the ear. A three-axis magnetometer is positioned in the body outside of the rear plate and constructed and arranged to sense the Earth's magnetic field in three orthogonal axes. A nulling magnet is positioned in the body proximate the outside of the rear plate. The nulling magnet is constructed and arranged to produce a nulling magnetic field that reduces the strength of the transducer magnetic field at the three-axis magnetometer. The transducer magnet, the rear plate, and the nulling magnet are symmetric with respect to a longitudinal axis. The nulling magnet may be cylindrical. The wearable audio device may further comprise a shield that comprises magnetic material and is located outside of the rear plate and the nulling magnet. The electro-acoustic transducer may further comprise a voice coil gap outside of the transducer magnet, and a cup comprising magnetic material and located outside of the rear plate.

In another aspect, a wearable audio device includes an electro-acoustic transducer for creating audio output, the electro-acoustic transducer comprising an annular transducer magnet that produces a transducer magnetic field having a magnetic field strength and a front side and a rear side, a rear plate comprising magnetic material and located against the rear side of the transducer magnet, wherein the rear plate has an outside, and a front plate comprising magnetic material and located against the front side of the transducer magnet. A shield can comprising magnetic material is located outside of the rear plate and surrounding the front plate, the transducer magnet, and the rear plate, the shield can having an outside. A three-axis magnetometer is positioned outside of the shield can and is constructed and arranged to sense the Earth's magnetic field in three orthogonal axes. A nulling magnet is positioned between the rear plate and the shield can, and is constructed and arranged to produce a nulling magnetic field that reduces the strength of the transducer magnetic field at the three-axis magnetometer.

DETAILED DESCRIPTION

Wearable audio devices (one non-limiting example being earphones) can include a transducer magnet, and can also include one or both of a docking magnet and a parking magnet. Wearable audio devices many times include other magnetic devices, for example a magnetometer, ferrite cores (which may be used in filters, for example), and magnetic reed switches, to name only several of many possible magnetic devices in a wearable audio device such as an earbud. These magnetic devices are typically designed to operate without substantial interference from stray magnetic fields. Magnetic devices typically operate in a stable operational range only if the strength of any stray magnetic field is relatively low. The magnets of a wearable audio device (e.g., the transducer magnet, the docking magnet, and/or the parking magnet) can emit stray magnetic fields that can negatively impact the operation of other magnetic devices of the wearable audio device.

When wearable audio devices (e.g., earphones) include a magnetometer, the magnetometer can be located close to the transducer magnet and/or other magnets. The magnetic field from any one or more of these magnets can overwhelm the magnetometer and prevent it from properly detecting the strength of the Earth's magnetic field.

Negative effects on a magnetic device of a wearable audio device due to stray magnetic fields at the location of the magnetic device can be reduced with an additional nulling magnet that has a magnetic field that partially or fully nulls the stray magnetic field(s) at the location of the magnetic device. For example, when the magnetic device is a magnetometer, one or more nulling magnets can be used to bring the magnetometer into a region of stable operation, where the magnetometer can operate in its operational region where stray magnetic fields do not overwhelm the Earth's magnetic field. Any nulling should be sufficient such that the magnetic device can operate in its operational region where stray magnetic fields do not overwhelm it. If the transducer magnet, the nulling magnet, and the magnetometer are aligned along an alignment axis (i.e., they are coaxial), and the magnetic field direction and strength of the nulling magnet is appropriate, the transducer magnetic field at the magnetometer can be nulled in all three orthogonal axes or dimensions.

Figure 1:
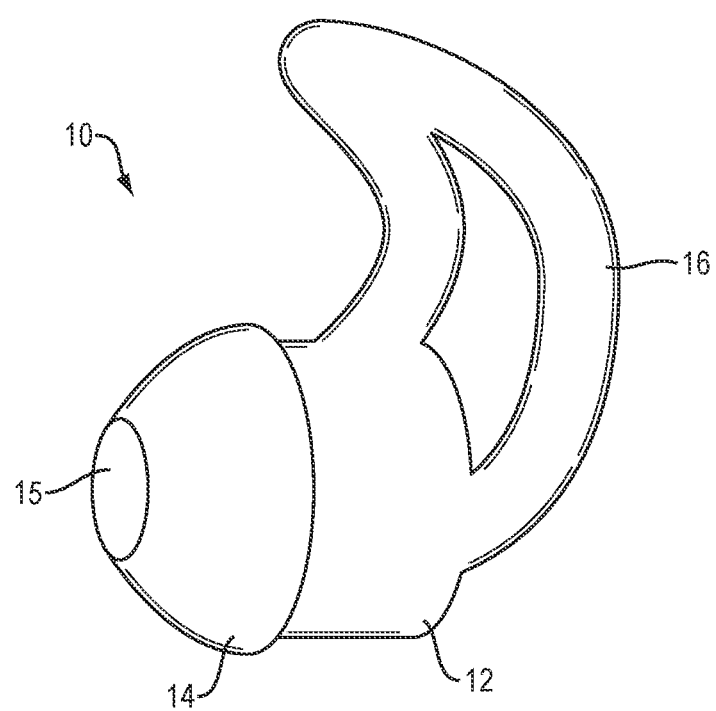
FIG. 1 is perspective view of an earphone.

FIG. 1 is a perspective view of a wireless in-ear headphone, earphone, or earbud, 10. An earphone is only one non-limiting example of the subject wearable audio device. Other examples are described elsewhere herein. Earbud/earphone 10 includes body or housing 12 that houses the active components of the earbud. Portion 14 is coupled to body 12 and is pliable so that it can be inserted into the entrance of the ear canal. Sound is delivered through opening 15. Retaining loop 16 is constructed and arranged to be positioned in the outer ear, for example in the antihelix, to help retain the earbud in the ear. Earbuds are well known in the field (e.g., as disclosed in U.S. Pat. No. 9,854,345, the disclosure of which is incorporated herein by reference for all purposes), and so certain details of the earbud are not further described herein. An earbud 10 is an example of a wearable audio device according to this disclosure, but is not limiting of the scope of this disclosure as stray magnetic fields from one or more magnets at the location of a magnetic device in in other types of wearable audio devices can also be resolved in accordance with the present disclosure.

Figure 2:
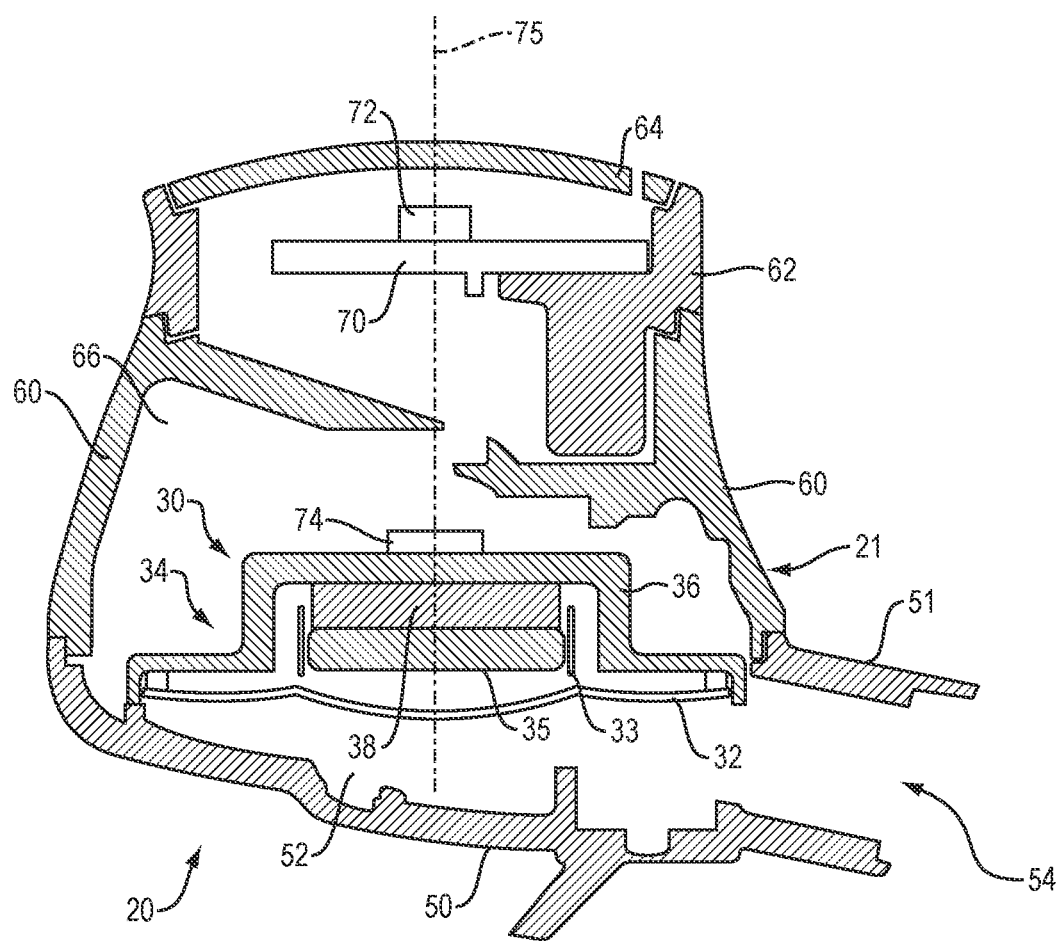
FIG. 2 is a partial cross-sectional view of elements of an earphone.

FIG. 2 is a partial cross-sectional view of only certain elements of an earphone 20 that are useful to a better understanding of the present disclosure. Earphone 20 comprises housing 21 that encloses electro-acoustic transducer 30. Housing 21 comprises front housing portion 50 and rear housing portions 60 and 62. Transducer 30 has diaphragm 32 that is driven in order to create sound pressure in front acoustic cavity 52. Sound pressure is directed out of front housing portion 50 via opening 54. When earphone 20 is an earbud, as shown by earbud 10 in FIG. 1, there is typically a pliable tip (not shown) that is engaged with neck 51 of housing portion 50, to help direct the sound into the ear canal and to seal to the ear canal opening. Earphone housing 21 further comprises a rear enclosure made from rear housing portions 60 and 62, and grille 64. Note that the details of earphone 20 are exemplary of aspects of earphones and are not limiting of the scope of this disclosure, as the present magnetic field reduction at the location of the magnetometer or other magnetic device can be used in varied types and designs of earphones and other wearable audio devices.

Transducer 30 further comprises magnetic structure 34. Magnetic structure 34 comprises transducer magnet 38 and magnetic material that functions to confine and guide the magnetic field from magnet 38, so that the field properly interacts with coil 33 to drive diaphragm 32, as is well known in the electro-acoustic transducer field. The magnetic material comprises cup 36 and front plate 35, both of which are preferably made from a material with relatively high magnetic susceptibility, also as is known in the field.

Three-axis magnetometer 72 is mounted on PCB 70 and is arranged to sense the strength of magnetic fields in three axes at the location of the magnetometer, as is known in the field. Magnetometer 72 is configured to detect the Earth's magnetic field. The output of magnetometer 72 can be used to determine the direction in which the wearer's head is pointed, as described in U.S. Patent Application 62/626,967, filed on Feb. 6, 2018, the entire disclosure of which is incorporated herein by reference. As discussed above, earphone 20 may additionally or alternatively include other magnetic devices that might be adversely impacted by the stray magnetic field from a transducer, coupling, docking and/or parking magnet.

Since magnetometer 72 is relatively close to transducer magnet 38 (in a wireless earbud magnetometer 72 and transducer magnet 38 may be separated by only about 2 mm) the transducer's magnetic field can overwhelm the magnetometer and prevent it from properly detecting the strength of the Earth's magnetic field. The magnetometer can be brought into its specified measurement range (where stray magnetic fields do not overwhelm or skew the desired measurement) with an additional nulling magnet. Nulling magnet 74 is in this non-limiting example coupled to the outside of cup 36 (i.e., the surface of cup 36 that faces magnetometer 72).

Magnet 74 is located such that its magnetic field partially or fully nulls or reduces the transducer magnetic field at the location of magnetometer 72. This transducer magnetic field nulling should take place in any one, two, or three of the three orthogonal sense axes in which stable operation of the magnetometer is needed. In the present case, stable magnetometer results are desired in all three axes, so magnet 74 is desirably configured to sufficiently null the Earth's magnetic field in all three axes. It should be understood that the location of nulling magnet 74 in FIG. 2 is representative, and magnet 74 may actually be located elsewhere in the wearable audio device, either between the transducer and the magnetometer or on the opposite side of the magnetometer from the transducer. In the present example, nulling magnet 74 is located on or proximate the outside of the transducer magnetic structure (which in this non-limiting example comprises cup 36). It should also be understood that magnet 74 could be a permanent magnet or an electromagnet, it being necessary only to properly size, place and orient a nulling magnetic field, as described herein. The nulling should be sufficient such that magnetometer 72 can operate in at least one sense axis in its operational region where stray magnetic fields do not overwhelm the Earth's magnetic field to the point where the Earth's magnetic field can't be properly sensed. Linear operation of magnetometers (where there are stray magnetic fields that are not so strong that they overwhelm sensing or detection of the desired field) is known in the technical field, and so is not further described herein.

Transducer magnet 38, magnetometer 72, and nulling magnet 74, are all preferably (but not necessarily) located on and symmetric with respect to axis 75. The magnetic fields of magnets 38 and 74 will superimpose at the location of magnetometer 72 and in some instances may provide self-cancellation along two of the three orthogonal sense axes. The properties of and location of nulling magnet 74 can then be selected such that the superimposed fields on the remaining orthogonal axis cancel at magnetometer 72. Alternatively, rather than fully canceling or reducing the field along all three orthogonal sense axes, the nulling magnet can reduce the magnitude of the transducer magnet's field at magnetometer 72 along only one orthogonal axis, or along two orthogonal axes, ideally to the point where the magnetometer can properly detect the Earth's magnetic field.

The properties of and location of nulling magnet 74 can be determined in one non-limiting example as follows. Magnetic fields have both a direction and magnitude. Once the direction and magnitude of the field from transducer magnet 38 (and any other magnets that may have an effect on the magnetometer) at the magnetometer are known, a nulling magnet can be chosen and its location and orientation determined such that (at the necessary location(s) of the magnetometer where the fields in each axis are sensed), in the case where the transducer magnet 38, magnetometer 72, and nulling magnet 74 are not located on and symmetric with respect to axis 75, its field in all three axes (x, y, and z) is coaxial with and matches the magnitude of the stray field, and has an opposite direction. In the case where the transducer magnet 38, magnetometer 72, and nulling magnet 74 are located on and symmetric with respect to axis 75, nulling magnet 74 can be chosen and its location and orientation determined such that (at the necessary location(s) of the magnetometer where the fields in each axis are sensed), its field in at least one axis is coaxial with and matches the magnitude of the stray field, and has an opposite direction. In both cases, if the alignment of the fields and the matching of magnitudes of the fields is proper, and the directions are opposite, the fields will cancel, resulting in the nulling of the stray field(s) at the magnetometer in all three axes. The direction of the nulling magnet field is determined based on the orientation of the N-S poles. The magnitude of the nulling magnet field can be established based at least on one or more of the nulling magnet's magnetization, material, shape, size, and location.

Figure 3:
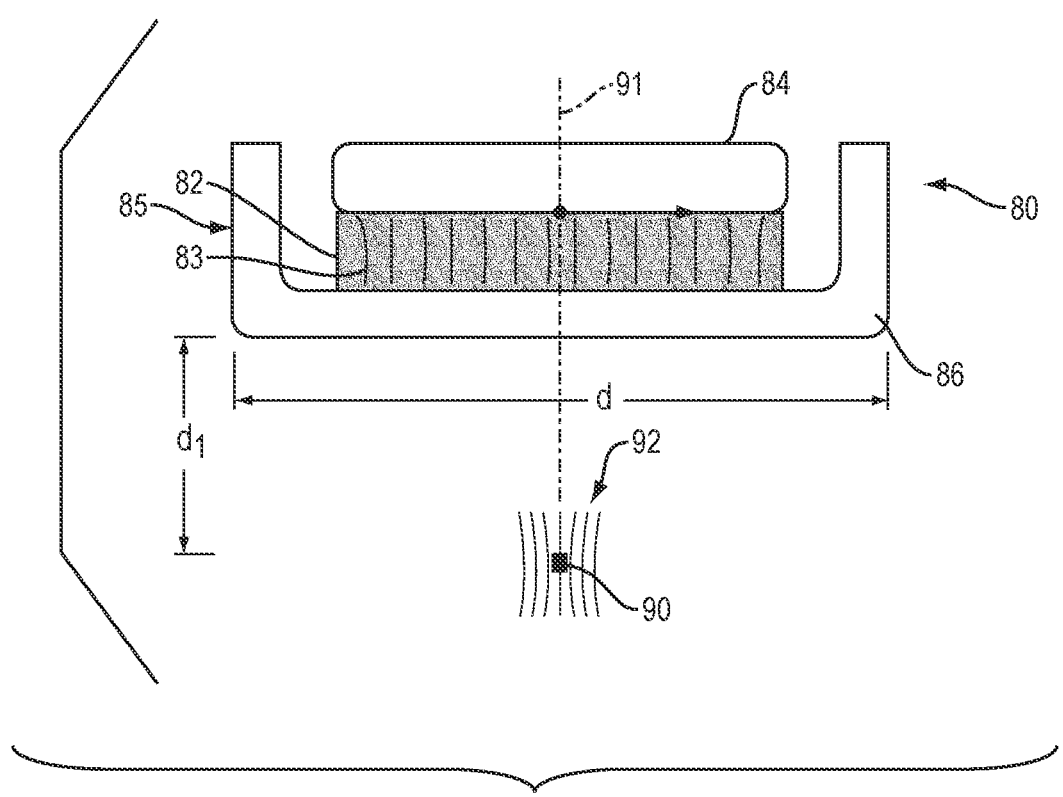
FIG. 3 is a schematic view of the magnetic structure of an earphone and its magnetic field at the location of a magnetic field sensor.
Figure 4:
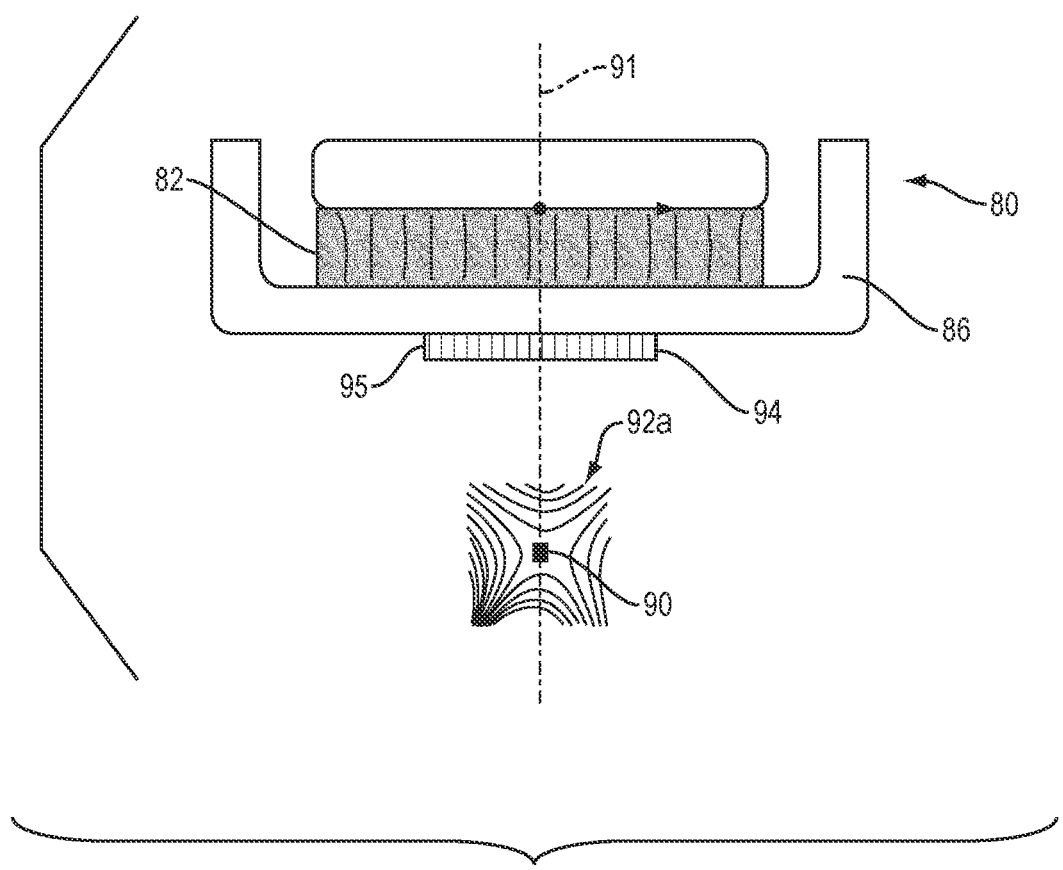
FIG. 4 is a view similar to that of FIG. 3 but including a nulling magnet.

FIGS. 3 and 4 illustrate aspects of an earphone. Earphone electro-acoustic transducer 80 comprises transducer magnet 82, and a magnetic structure 85 that comprises cup 86 and front member 84. Magnet 82 has a magnetic field, which is represented by the generally vertical field line representations 83. Magnetic fields and field line representations are well known in the art and so are not further described herein. The magnetic structure 85 spans a distance "d." Magnetometer 90 is spaced a distance "$d_1$" from magnetic structure 85 and is coaxial with magnet 82 along axis 91. The field from magnet 83 in the vicinity of magnetometer 90 is schematically represented by field lines 92. In the example, the field strength of the magnetic field from magnet 82 in the vicinity of magnetometer 90 is about 500 μT. Note that the field strength is unlikely to be the same in each of the three axes. The 500 μT value is simply representative of what the field strength may be in any one or more of the three axes. In contrast, the strength of the Earth's magnetic field is generally approximately 50 μT, or about $\frac{1}{10}^{th}$ of the field from magnet 82. With a stray field such as this that overwhelms the field to be sensed, magnetometer 90 can be inaccurate. Accordingly, the look direction sensing involving magnetometer 90 can be inaccurate. It should be understood that electro-acoustic magnet transducers can have varied shapes, sizes, locations, and field strengths, and that the illustrative values set forth in the examples are not limiting of the scope of this disclosure.

FIG. 4 illustrates schematically an effect of nulling magnet 94. Nulling magnet 94 is coupled to (e.g., adhered to) the outside of cup 86 and is preferably but not necessarily located on and symmetric with respect to axis 91. Nulling magnet 94 has a magnetic field, which is represented by the generally vertical field line representations 95. Nulling magnet 94 has a size, shape, magnetic orientation, magnetic field strength, and location relative to transducer 80 and magnetometer 90 such that its magnetic field is superimposed on the field from the transducer magnet 82 at the location of magnetometer 90 sufficiently to fully or partially null the transducer field in one, two, or three orthogonal axes (depending in part on whether transducer magnet 72, magnetometer 90, and nulling magnet 94 are located on and symmetric with respect to axis 91). In this non-limiting example, field nulling is indicated by field line representation 92a, showing a field null at magnetometer 90 (i.e., no field lines intersect magnetometer 90). Note that nulling could be accomplished with one or more separate nulling magnets. Also, the field that is nulled could be from the transducer magnet and/or from the parking or docking magnet. The nulling should be sufficient to reduce the stray magnetic field(s) to below the level where the magnetometer can operate in its normal operational range. The strength of stray fields that would bring a magnetometer out of its normal operational range are dependent on the particular magnetometer used.

It should be understood that the field does not need to be fully nulled by nulling magnet 94. Rather, as described above, the strength of the field needs to be reduced sufficiently such that the magnetometer can sense the Earth's magnetic field. The reduction in the transducer field at the magnetometer that needs to be accomplished with the nulling magnet will in part depend on the particular magnetometer used, as would be apparent to one skilled in the field.

Also, it should be understood that magnetic fields are three-dimensional, while FIGS. 3 and 4 are two-dimensional. Those skilled in the field will understand the extent to which the transducer magnet's field in three dimensions needs to be nulled in order for the sensing of the Earth's magnetic field to be accomplished with sufficient accuracy for the particular application of the Earth's magnetic field sensor, and can make an appropriate selection of the nulling magnet parameters described above to accomplish such results.

In one non-limiting example, transducer magnet 82 can be a generally cylindrical magnet with a diameter of about 8 mm, and cup 86 can have a diameter d of about 10 mm. In one non-limiting example, sensor 90 can be positioned less than about 10 mm from transducer 80. In one non-limiting example, the magnetic field strength of the transducer magnet at sensor 90 is at least about 100 µT. In one non-limiting example the magnetic field strength outside of transducer 80 is as high as $1 \times 10^{-9}$ T. With a cylindrical nulling magnet 94 having a diameter of about 1.75 mm and a thickness of about 0.5 mm, where magnetometer 90 is located in a region that is about 1.75 mm to 2.5 mm below nulling magnet 94, nulling magnet 94 can be effective to reduce the magnetic field to about $4 \times 10^{-11}$ T.

Figure 5A:
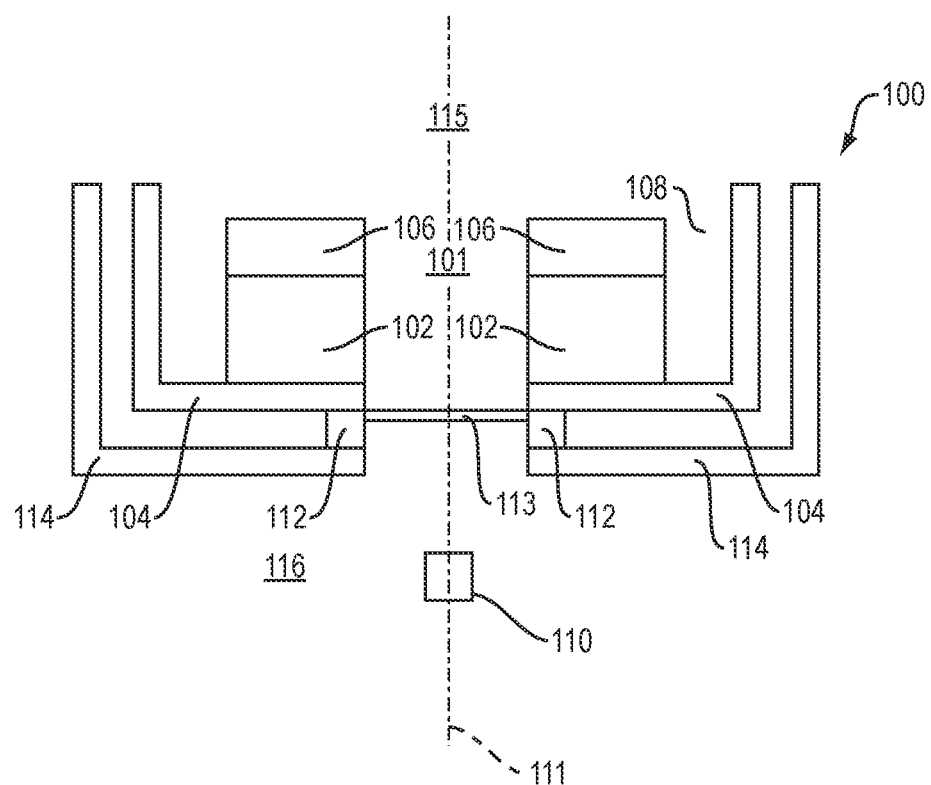
FIG. 5A is a partial cross-sectional view of elements of an earphone.

FIG. 5A illustrates only some aspects of earphone electro-acoustic transducer 100 with an integrated nulling magnet according to aspects of this disclosure. Transducer 100 comprises transducer magnet 102, cup 104, and front plate 106. The coil (not shown but located in gap 108), the diaphragm, and other aspects of an electro-acoustic transducer are not shown, simply for ease of illustration. Transducer 100 includes center air vent 101 that at least in part accomplishes pressure equalization between the acoustic front volume 115 and the acoustic back or rear volume 116, as is known in the art. Optional acoustically-resistive mesh 113 may span the opening that comprises air vent 101 at some point along the length of the air vent in order to reduce air flow through vent 101 and tune the transducer, as is known in the field. Each of magnet 102, cup 104, and front plate 106 have a central opening (which is typically but not necessarily symmetric about longitudinal axis 111) in order to accomplish air vent 101. Magnetometer 110 is located in back volume 110. Nulling magnet 112, which is annular, is located on the rear side of cup 104. Nulling magnet 112 partially or fully nulls the field from transducer magnet 102 at magnetometer 110, as described above. Mesh 113 is depicted as coupled to magnet 112, which is not a limitation as mesh 113 could potentially be located anywhere else along the length of air vent 101.

Shield 114 is located between nulling magnet 112 and magnetometer 110. Shield 114 is can-shaped, and has a central opening to accommodate vent 101. Shield 114 is made from a magnetic material so that it helps to further shield magnetometer 110 from the field from magnet 102, which can help to null the field sufficiently for the magnetometer to function properly. Shield 114 can be made of mu metal, which is a soft ferromagnetic alloy with very high permeability and that is effective to shield equipment against static or low frequency magnetic fields. The thickness of shield 114 can be selected to achieve a desired shielding effect. Since shield 114 also shields the field from nulling magnet 112, a nulling magnet with a higher flux density than would be the case if shield 114 was not present may be required. Shield 114 thus may not be helpful to nulling of the transducer magnetic field at the location of the magnetometer in all situations.

Figure 5B:
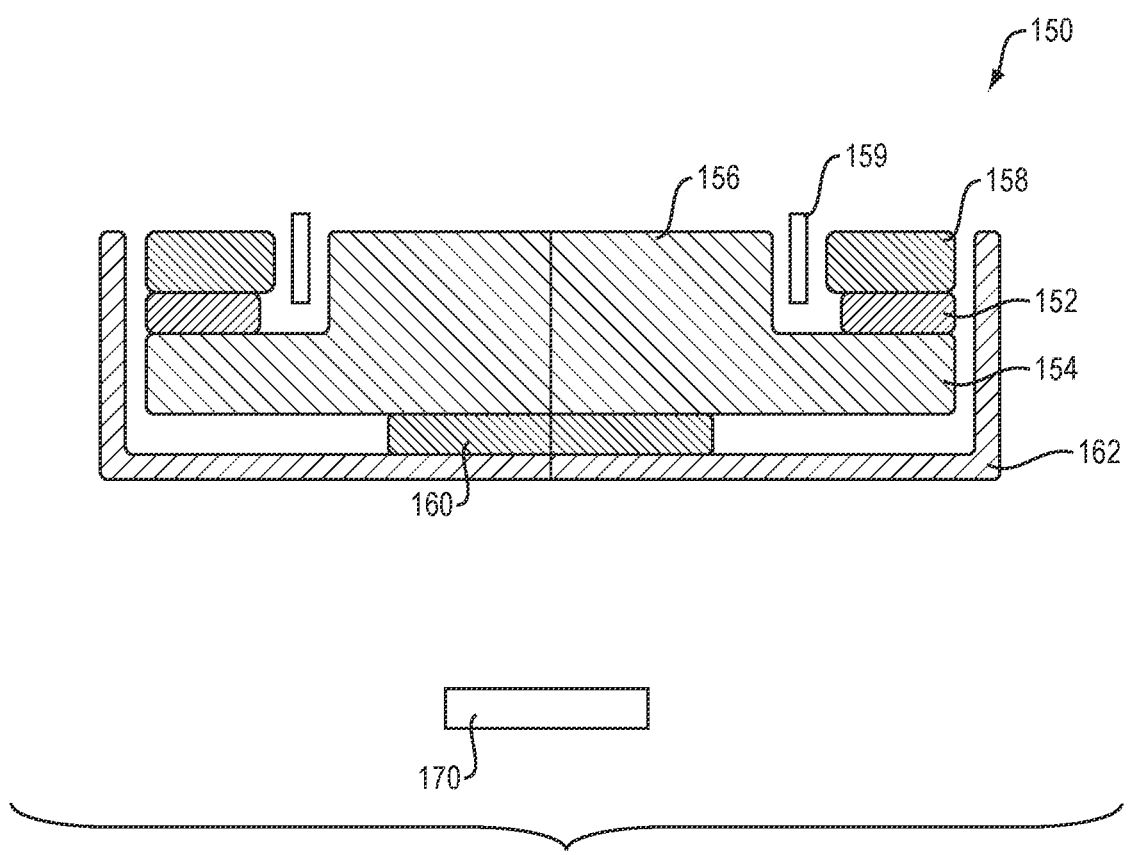
FIG. 5B is a partial cross-sectional view of elements of another earphone.

Note that transducer 100 could alternatively be a non-vented design (such as illustrated in FIGS. 2-4), in which case nulling magnet 112 would typically be disc-shaped rather than annular, and shield 114 (if present) would typically be a continuous can without a center opening along axis 111. A non-limiting example is shown in FIG. 5B. Transducer 150 comprises transducer magnet 152 (which is located outside of voice coil 159), front plate 158 (which is located outside of voice coil 159), and rear plate 154 with center post 156. Shield can 162 surrounds all of these transducer components. Nulling magnet 160 is located between and against back plate 154 and shield can 162. Magnetometer 170 is outside of transducer 150. In one non-limiting example the magnetic field strength outside of transducer 150 is as high as $1 \times 10^{-9}$ T. With a cylindrical nulling magnet 160 having a diameter of about 1.75 mm and a thickness of about 0.5 mm, where magnetometer 170 is located in a region that is about 1.75 mm to 2.5 mm below shield can 162, nulling magnet 160 can be effective to reduce the magnetic field to about $4 \times 10^{-11}$ T. With transducer magnet 152 located outside of voice coil 159, nulling magnet 160 can be magnetized in the same north-south orientation or direction as transducer magnet 152. This is in contrast to the example of FIG. 5A in which the transducer magnet is inside of the voice coil, wherein the nulling magnet would typically need to be magnetized in the opposite direction as compared to the transducer magnet.

Figure 6:
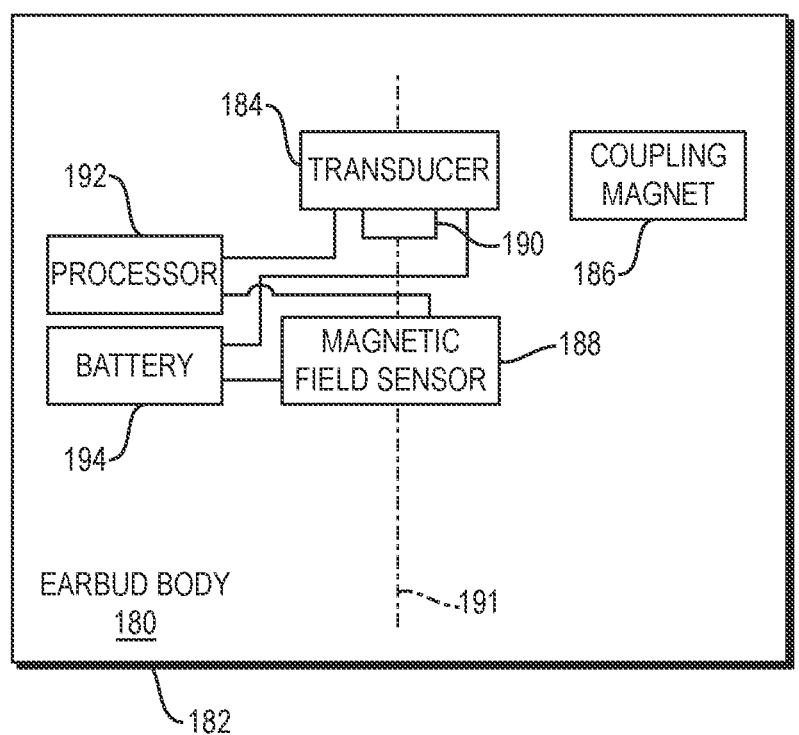
FIG. 6 is a schematic diagram of an earphone.

FIG. 6 is a schematic diagram of in-ear headphone 182, illustrating in part an additional coupling or parking magnet 186. The described components can be located in earbud body 180. Battery 194 provides power to powered components. Processor 182 is used, in part, to drive transducer 184. Processor 192 is also used to determine the wearer's look direction, in part using the output of magnetic field sensor 188. It should be understood that earphones will have more components and can have different components than those shown in FIG. 6. Some earphones include one or more magnets other than the transducer magnet. One such other magnet is represented in this non-limiting example by coupling or parking magnet 186. Coupling or parking magnet 186 can be used to couple or park earphone 182 to another structure. As one non-limiting example, magnet 186 can be used to "dock" an earbud to a battery charger. As another non-limiting example, magnet 186 can be used to park an earbud to another structure, such as a neckband or another earbud. Other uses of coupling and/or parking magnets are known in the field and are included within the scope of the present disclosure.

The docking and/or the parking magnet (e.g., magnet 186) has opposed first and second sides. The second side of the docking or parking magnet can be closer to the magnetic field sensor (or a different magnetic device) than is the first side. The flux of the magnetic field from the first side of the docking or parking magnet can have a greater magnitude than the flux of the magnetic field from its second side. In one non-limiting example the docking or parking magnet comprises a Halbach array. A Halbach array is a configuration of three or more permanent magnets, or three or more differently magnetized regions of a monolithic structure, arranged such that on one side of the Halbach array the magnetic fields reinforce and on another side of the Halbach array (typically, the opposite side) the fields cancel. One arrangement, which may be termed a discrete Halbach array, comprises three permanent magnets arranged side-by-side into a generally planar Halbach array. Another arrangement, which may be termed a continuous Halbach array, comprises three side-by-side regions of a monolithic structure where the regions are magnetized differently from one another. Note that either or both of the docking and parking or clasping magnet can be a Halbach array.

An advantage of a Halbach array is that its magnetic field is strong on one side and weak on the other side. If the side on which the field is strong is placed close to or against the inside surface of a wearable audio device housing, the field is better able to couple or park to another structure. At the same time, the field on the opposite side facing into the wearable audio device housing is weak and so it has less effect on the magnetometer and/or other magnetic device(s) as compared to a single magnet that has equal field strength on both sides, used as a parking or docking magnet. The effect of the Halbach array field at the magnetometer and/or other magnetic device(s) may be small enough that a separate nulling magnet may not be needed. In other words, the combined fields at the magnetometer and/or other magnetic device(s) from the Halbach array and the transducer magnet(s) may be small enough that the magnetometer and/or other magnetic device(s) can operate in its linear range without the need for an additional nulling magnetic field. Another advantage of a Halbach array is that it can achieve the same parking or docking field as a single magnet in less volume and less thickness than a single magnet. This frees up space in the earphone for other components or other functionalities. Another advantage is that the magnetic field on one side of the parking/docking magnet is stronger than the magnetic field of a comparably-sized single magnet.

All of the magnets in earbud body 180 of earphone 182 create magnetic fields that can adversely impact the accuracy of the sensing of the Earth's magnetic field by sensor 188, as described above. Nulling magnet 190 is included, and is preferably coaxial with the magnet of transducer 184 and with magnetic field sensor 188, as indicated by axis 191. By proper sizing, orientation and placement of nulling magnet 190, the magnetic field from transducer 184 (and from additional magnet 186 when it is present) at sensor 188 can be reduced such that sensor 188 can detect the Earth's magnetic field, as described above.

One or more of the above described systems and methods, in various examples and combinations, may be used in a wide variety of audio systems, including wearable audio devices in various form factors. Unless specified otherwise, the term wearable audio device, as used in this document, includes headphones and various other types of personal audio devices such as head, shoulder or body-worn acoustic devices (e.g., audio eyeglasses or other head-mounted audio devices) that include one more acoustic transducers to receive and/or produce sound, with or without contacting the ears of a user. It should be noted that although specific implementations of speaker systems primarily serving the purpose of acoustically outputting audio are presented with some degree of detail, such presentations of specific implementations are intended to facilitate understanding through provisions of examples and should not be taken as limiting either the scope of disclosure or the scope of claim coverage.

Elements of FIG. 6 are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

The example of FIG. 6 comprises a processor that is configured to use computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other examples are within the scope of the following claims.

What is claimed is:

1. A wearable audio device, comprising:
   an electro-acoustic transducer for creating audio output, the electro-acoustic transducer comprising a transducer magnet that produces a transducer magnetic field having a magnetic field strength, and a magnetic structure that guides the transducer magnetic field, wherein the transducer magnet is on an inside of the magnetic structure, and the magnetic structure has an outside;
   a magnetic field sensor outside of the magnetic structure and constructed and arranged to sense the Earth's magnetic field; and
   a nulling magnet coupled to the outside of the magnetic structure and constructed and arranged to produce a nulling magnetic field that reduces the strength of the transducer magnetic field at the magnetic field sensor.

2. The wearable audio device of claim 1, wherein the magnetic field sensor comprises a three-axis magnetometer.

3. The wearable audio device of claim 1, wherein the nulling magnet comprises a permanent magnet.

4. The wearable audio device of claim 1, wherein the nulling magnet comprises an electromagnet.

5. The wearable audio device of claim 1, comprising an earbud comprising an earbud body, and wherein the electro-acoustic transducer, the magnetic field sensor, and the nulling magnet are all located within the earbud body.

6. The wearable audio device of claim 5, wherein the earbud body is constructed and arranged to be positioned so as to direct the audio output toward the ear of the wearer.

7. The wearable audio device of claim 1, wherein the transducer magnet, the magnetic structure, and the nulling magnet are aligned along a longitudinal axis.

8. The wearable audio device of claim 7, wherein the magnetic field sensor is also aligned along the longitudinal axis.

9. The wearable audio device of claim 7, wherein the transducer magnet, the magnetic structure, and the nulling magnet are symmetric with respect to the longitudinal axis.

10. The wearable audio device of claim 1, wherein the nulling magnet is cylindrical.

11. The wearable audio device of claim 1, wherein the nulling magnet is annular.

12. The wearable audio device of claim 11, wherein the nulling magnet comprises a central opening, and wherein the wearable audio device further comprises an acoustically-resistive mesh over the central opening of the nulling magnet.

13. The wearable audio device of claim 1, further comprising a magnetic field shield located between the nulling magnet and the magnetic field sensor.

14. The wearable audio device of claim 13, wherein the magnetic field shield comprises a cup comprising magnetic material.

15. The wearable audio device of claim 1, wherein the transducer magnetic field at the magnetic field sensor has a direction along a magnetic field axis, and wherein the nulling magnetic field at the magnetic field sensor has an opposite direction along the magnetic field axis.

16. The wearable audio device of claim 1, wherein the magnetic field sensor has a sensed magnetic field range where it operates linearly, and wherein the nulling magnetic field reduces the strength of the transducer magnetic field at the magnetic field sensor such that the sensed magnetic field strength is in the sensed magnetic field range where the magnetic field sensor operates linearly.

17. A wearable audio device, comprising:
an electro-acoustic transducer for creating audio output, the electro-acoustic transducer comprising a transducer magnet that produces a transducer magnetic field having a magnetic field strength, and a rear plate comprising magnetic material, wherein the rear plate is configured to guide the transducer magnetic field, wherein the transducer magnet is on an inside of the rear plate, and the rear plate has an outside;
a body constructed and arranged to be positioned at an ear of a wearer so as to direct the audio output at the ear of the ear;
a three-axis magnetometer positioned in the body outside of the rear plate and constructed and arranged to sense the Earth's magnetic field in three orthogonal axes; and
a nulling magnet positioned in the body proximate the outside of the rear plate, the nulling magnet constructed and arranged to produce a nulling magnetic field that reduces the strength of the transducer magnetic field at the three-axis magnetometer;
wherein the transducer magnet, the rear plate, and the nulling magnet are symmetric with respect to a longitudinal axis.

18. The wearable audio device of claim 17, wherein the nulling magnet is cylindrical.

19. The wearable audio device of claim 17, further comprising a shield can comprising magnetic material and located outside of the rear plate and the nulling magnet.

20. The wearable audio device of claim 17, wherein the electro-acoustic transducer further comprises a voice coil gap outside of the transducer magnet, and a cup comprising magnetic material and located outside of the rear plate.

* * * * *